United States Patent [19]

Rust et al.

[11] Patent Number: 5,125,743
[45] Date of Patent: Jun. 30, 1992

[54] INSTRUMENT FOR MEASURING SOLAR MAGNETIC FIELDS

[75] Inventors: David M. Rust, Silver Spring, Md.; John W. O'Byrne, Sunshot, N. Mex.; Terry J. Harris, Baltimore, Md.

[73] Assignee: The United States of America as represented by the Secretary of the Air Force, Washington, D.C.

[21] Appl. No.: 455,678

[22] Filed: Dec. 22, 1989

[51] Int. Cl.$^5$ ............................................ G01N 21/21
[52] U.S. Cl. .................................... 356/367; 356/352
[58] Field of Search ............... 356/352, 364, 365, 366, 356/367, 368, 402, 416, 419

[56] References Cited

U.S. PATENT DOCUMENTS 4,508,964 4/1985 Gunning, III et al. ............. 356/352

OTHER PUBLICATIONS

Lindgren et al, SPIE vol. 265, Supplement-Shuttle Pointing of Electro-Optical Experiments, 1981, pp. 47-52.
Rust et al, "Solar Vector Magnetograph for Max '91 Programs," presented at the Max '91 Workshop of the American Astronomical Society Solar Physics Div. meeting, Kansas City, Mo., Jun. 6-10, 1988, pp. 113-120.
Rust et al, "An Optical Instrument for Measuring Solar Magnetism", John Hopkins APL Technical Digest, vol. 9, No. 4 (1988), pp. 349-359.
NASA Tech Memo 4048 "The SAMEX Vector Magnetograph" Jun. 1988.
C. H. Burton et al, "Electrooptic Fabry-Perot filter: development for the study of solar oscillations", Appl. Opt. 226, 2637 (1987).
D. M. Rust et al, "Development of Ultrastable Filters and Lasers for Solar Seismology", Johns Hopkins APL Tech. DIG. 7, 209-216 (1986).
W. Gunning, "Double-cavity electrooptic Fabry-Perot tunable filter", Appl. Opt. 21, 3129 (1982).

*Primary Examiner*—F. L. Evans
*Attorney, Agent, or Firm*—Thomas C. Stover; Donald J. Singer

[57] ABSTRACT

In a solar vector magnetograph for measuring solar magnetic fields including a telescope pointable to a solar zone and relay optics mounted there-behind, including a collimating lens, a quarter wave plate, a light polarizer, a beam expanding means, a narrow bandpass blocking filter to admit a narrow spectral band of polarized light, a reimaging lens to focus the resulting beam and an image receiver, the improvement provided is a solid Fabry-Perot etalon filter which is mounted between the blocking filter and the reimaging lens, such filter being of a desired refractive index and thickness so as to select a narrow band of the so-transmitted polarized light and to transmit same to the image receiver, all in order to isolate and record the emissions of atomic species and to infer the magnetic field at the solar zone. In another and preferred embodiment, the etalon filter is electrically tuneable to change its passband to select another narrow band of the transmitted polarized light and transmit it to the image receiver to record another image of the solar zone at the selected passband and compare with the image obtained at the previous passband to derive in greater detail a map of the intensity and the direction of the magnetic field in the solar zone, including the photosphere or the atmosphere thereabove so as to forecast solar flares and other disturbances based on solar magnetic field changes.

19 Claims, 3 Drawing Sheets

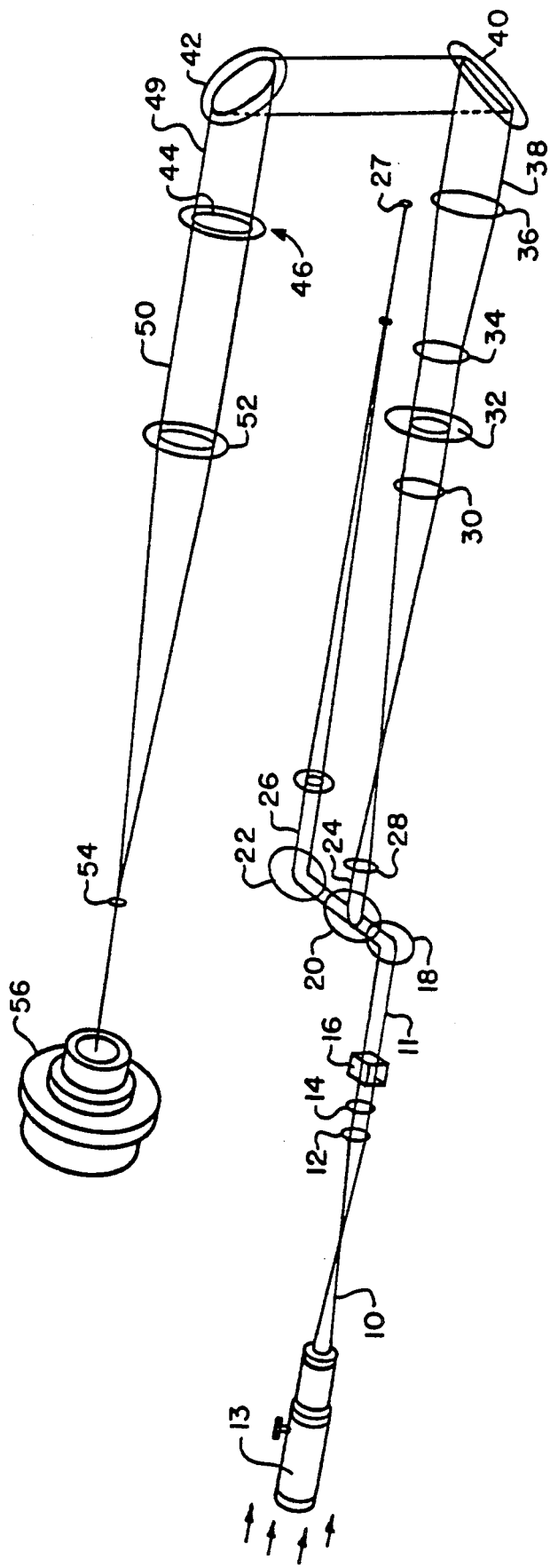
FIG. I

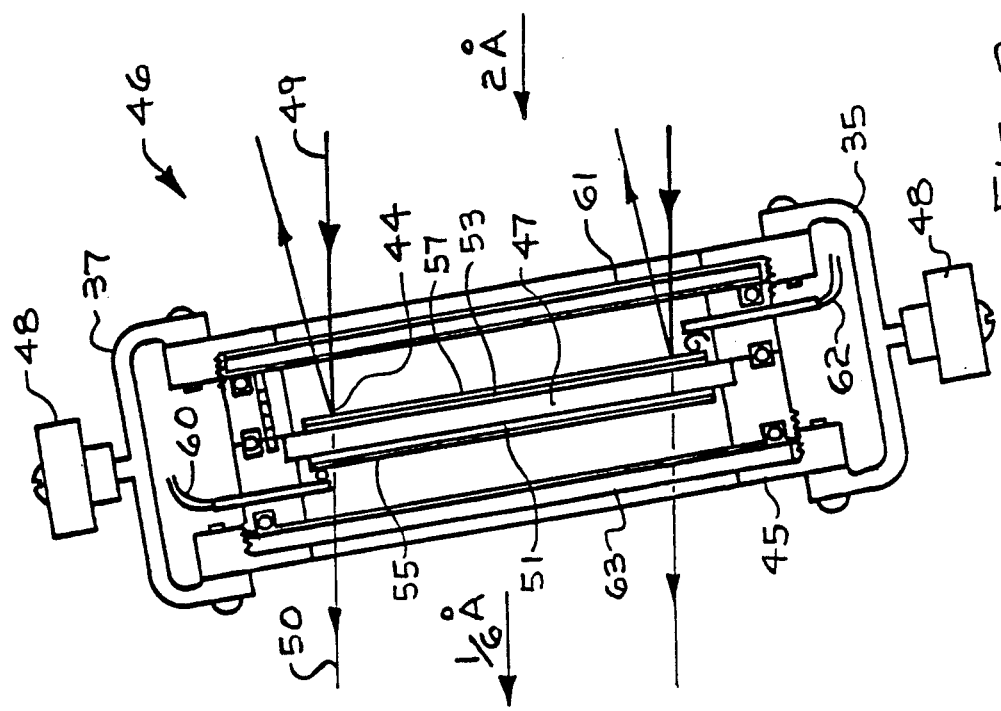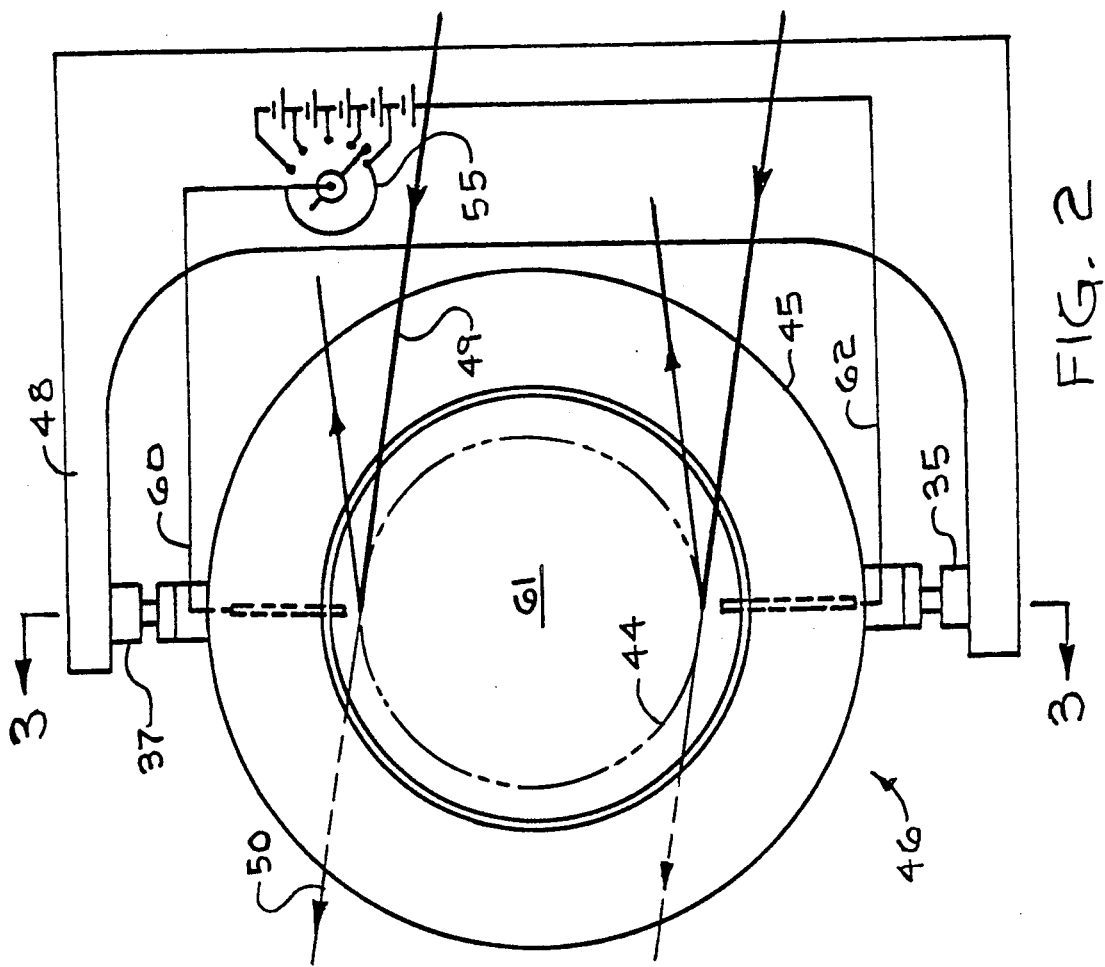

INSTRUMENT FOR MEASURING SOLAR MAGNETIC FIELDS

STATEMENT OF GOVERNMENT INTEREST

The invention described herein may be manufactured and used by or for the Government for governmental purposes without the payment of any royalty thereon.

BACKGROUND OF THE INVENTION

1. Field of the Invention

This invention relates to an apparatus for observing activity in the solar atmosphere particularly for observing and measuring solar magnetic fields.

2. The Prior Art

The sun is of seeming quiet brilliance when viewed directly or, e.g., through a dark filter. However the sun when viewed through a filter equipped telescope, reveals a boiling surface, sunspots, sudden brightenings (flares) and ejections of material (sprays). These activities, particularly solar flares and their effects on Earth, are unpredictable, as man, at the present time, has been unable to extract enough information from pre-flare observations. However a promising signal of an imminent major flare appears to be the emerging magnetic flux in the photosphere of the sun. Early detection of such emerging fields might give several hours warning before a major flare onset. That is, the intensity and direction of the magnetic field at the solar surface may be inferred from measurements of the polarization of sunlight in very narrow spectral bands. That effect was discovered in the laboratory by a P. Zeeman in 1896, and it was applied very shortly thereafter by a G. E. Hale to the measurement of magnetic fields in sunspots.

The Zeeman effect is characterized by the splitting of atomic spectral lines into two or more orthogonally polarized components, which splitting occurs when the atoms emitting the light are in a magnetic field. Using the optic system described below, the polarized components are separated and directed in turn through, e.g., two narrow band pass filters on to an image receptor for comparison purposes The process is repeated at different bandpass filter settings to provide a solar magnetic field map as more fully described below. In the past, an optical system called a solar magnetograph has been assembled and aimed at the sun in an attempt to detect such pre-flare emerging magnetic flux. However such prior art magnetograph, because of certain mechanical and design encumbrances has not provided a magnetograph sensitive enough to reliably detect pre-flare magnetic changes.

In particular, such prior art magnetograph has employed in the lens system, an ultra narrow band filter (for spectral discrimination) called a birefringent filter of heavy and complex layered design, requiring mechanical devices for wave length tuning. In addition such filters have proved difficult of repair.

Thus despite a recognized need for improved magnetographs, no new instrument has been built in the preceding twenty-five years. This is because the above birefringent filters, in addition to the above difficulties, have been too expensive, lacked sufficient light throughput and were difficult to tune in wavelength. Often such filters proved unreliable. Many such existing units were down for years, awaiting availability of skilled personnel.

Accordingly there has been a need and market for an improved instrument for measuring solar magnetism that overcomes the above prior art shortcomings.

There has now been discovered an improved solar measuring instrument wherein such a birefringent filter is replaced with a light-weight and durable component which admits such a narrow solar passband as to operate with sufficient sensitivity to monitor the solar atmosphere for magnetic field changes that presage solar flares or other disturbances.

SUMMARY OF THE INVENTION

Broadly the present invention provides in an instrument for observing and measuring solar magnetic fields, including a telescope pointable to a solar zone, and having mounted in optical alignment therebehind, a collimating lens, a light polarization analyzer, a beam expanding means, a narrow bandpass blocking filter to admit a narrow spectral band of polarized light, a reimaging lens to focus said beam and an image receiver, the improvement comprising, a solid etalon filter mounted between the blocking filter and the reimaging lens, which etalon filter is of a desired refractive index and thickness so as to select a narrow spectral band of the so-transmitted polarized light and transmit it to said image receiver all in order to isolate and record the emissions of atomic species and to infer therefrom, the magnetic field at the solar zone.

The invention further provides for applying an electric field to the solid etalon filter to change the refractive index thereof and thus the wavelength of light emissions transmitted along the optic axis of such filter. The etalon filter can also be tuned to a another passband or wavelength by changing such electric field.

BRIEF DESCRIPTION OF THE DRAWINGS

The invention will become more apparent from the following detailed specification and drawings in which;

FIG. 1 is a perspective schematic view of the instrument for measuring solar magnetic fields embodying the present invention;

FIG. 2 is a component of the instrument embodying the invention of FIG. 1;

FIG. 3 is a sectional elevation view of the component of FIG. 2 taken on lines 3—3, looking in the direction of the arrows.

DESCRIPTION OF PREFERRED EMBODIMENTS

Figure 4:
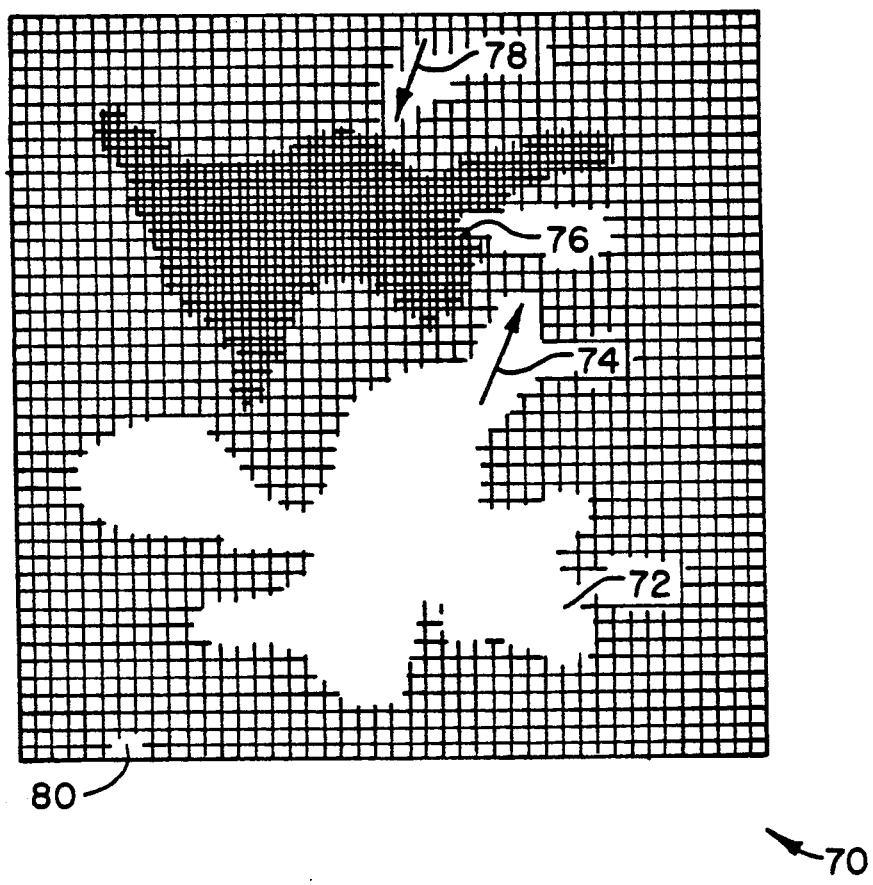
FIG. 4 is a plan view of a solar magnetogram obtained by the instrument of the present invention.

Referring now in more detail to the drawings, a beam of sunlight 10 from e.g. a reflecting telescope 13 is directed through a collimating lens 12, a quarter wave plate 14 and a rotatable Glan-Laser Prism (rotatable polarizer) 16, as shown or indicated in FIG. 1.

Other retarders and polarizers can be employed in combination, in the instrument of the invention, which, acting together permit complete analysis of the state of polarization of the incoming solar beam (from the telescope) and which together are known herein as a "polarization analyzer."

Then mounted in the optical path is a pivotable IMC (IMAGE MOTION COMPENSATION) mirror 18, which directs the polarized beam component to beam splitter 20 and IMC fold the mirror 22, which divides the beam component 11 into major beam 24 and minor beam 26, as shown in FIG. 1.

Following the beam splitter 20 in major optical path, are two beam expansion lenses 28 and 30, which beam splitter 20 expand the collimated and polarized beam component (still a white beam) to fill the clear aperture of blocking filter 32 which transmits but a narrow band of light from the major beam at a wavelength of, e.g. 6122Å with a bandwidth of 2521 . The so- filtered beam (now red) is then expanded further by beam expansion lenses 34 and 36 to form expanded parallel beam 38.

Such beam 38 is then redirected by fold mirrors 40 and 42 to the aperture 44 of a solid Fabry-Perot etalon filter 46 (herein "F-P etalon filter" or "etalon filter"), as shown in FIG. 1. The beam expansion lenses 34 and 36, thus locate a pupil image at the aperture 44 of the etalon 46, as shown or indicated in FIG. 1. Thus any imperfections in the etalon filter will affect all points in the solar image, equally. The maximum angle for rays entering the etalon filter is about 0.4°, which corresponds to a maximum spectral shift over the field of view of less than 30 mÅ. The etalon filter, an important component of the solar measuring instrument embodying the invention, is set or tuned to a desired refractive index so as to selectively transmit a narrow band of the light beam 50, e.g., at a bandwidth of less than 0.2Å, while rejecting the remainder of the beam 49 received from the blocking filter 32, as shown or indicated in FIGS. 1 and 3. The etalon filter is discussed more fully below.

After leaving the etalon filter 46, the so filtered beam 50 passes through a reimaging lens 52 and is focused through a microscope objective (5×) 54 to an image receiver, such as a CCD (charge-coupled-device) detector or camera 56, as shown in FIG. 1.

The above 5× microscope objective (or other image enlarging optic) can be dispensed with if desired to increase the field of view on the image detector at the expense of resolution.

The solid etalon of the invention desireably includes a solid wafer filter disposed between two reflective coatings which are, in turn, positioned between two conductive (and transparent) coatings. Such laminate should have the flatness and uniformity required to yield a sufficiently narrow passband i.e. one approximately equal to the half width of the spectral line used for the magnetic field measurements. The etalon filter of the invention should also be tuneable without mechanical means, as indicated above, e.g., by changing the refractive index along its optic axis, to permit different wavelengths of light to be transmitted therethrough. Previously, mechanical means were usually used to tune prior art filters either by varying the relative orientation of the components thereof (for birefringent filters) or by varying the spacing between mirrors (for air-spaced filters) or by tilting such filters with respect to the light beam.

In the solar observation system of the present invention, high voltage leads 60 and 62 are connected to conductive transparent coatings on either side of the F-P etalon filter 46, to provide a variable electric field for rapid passband tuning thereof as indicated in FIGS. 2 and 3.

The F-P etalon filters of the invention are preferably constructed from a thin wafer of lithium niobate (LiNbO$_3$) polished to 40-50 Å flatness However, wafers of other electro-optic crystals including ferroelectric oxide materials can be employed within the scope of the present invention such as Sr$_{1-x}$Ba$_x$Nb$_2$O$_6$.

As indicated in FIG. 3, the etalon wafer 47 is coated on opposite sides with a reflective coating 51 and 53 over which are disposed conductive (transparent) coatings 55 and 57, which, upon application of voltage thereto, by way of electric conductors 60 and 62 respectively, function much as a capacitor, generating an electric field which varies the passband of the etalon filter 46.

The wafer of the etalon filter used in the measuring instrument of the present invention is, e.g., 75 mm in diameter at a thickness of 0.25 mm and with excellent flatness as noted above, although other sizes can be employed as desired, within the scope of the present invention.

That is, the wafer thickness is sized such that the optical path length between its coated-on reflecting surfaces is an integer number of half waves, so that the etalon is optically resonant and passes through, the matching full target wavelength.

Such etalon filter has a passband of, e.g., 0.175 Å and its free spectral range (the spacing in between successive passbands) is, e.g., 3.5 Å although again, other sizes can be employed as desired, within the scope of the present invention. Thus the 75 mm wafer is mounted in the filter housing 45 around the periphery thereof, to present an effective aperture 44 of such filter 46 of about 69 mm, as indicated in FIG. 3.

As indicated above, spectral discrimination is accomplished with a large aperture, tuneable, solid Fabry-Perot etalon. In such F-P etalon, which is used in the solar observation instrument of the present invention, the higher the refractive index of the spacer (e.g., the lithium niobate wafer) the less the passband shifts and broadens for off-axis rays. The wavelength shift is given by:

$$\Delta\lambda/\lambda = \phi^2/2n^2$$

where $\lambda$ is the wavelength of the light or beam, '$\phi$' is the angle in radians between the incoming ray and the normal to the etalon filter and 'n' is the index of refraction of the spacer. Thus the acceptance cone of the lithium-niobate etalon, for which n=2.3, is 5.3 times that of an air-spaced etalon. That is, for the same spatial and spectral resolution, an air-spaced etalon must have 5.3 times the area of a lithium-niobate etalon, when used in an instrument with the same total field of view and telescope aperture.

As noted above, the etalon filter of the invention is electrically tuned. In the lithium niobate etalon, application of an electric field along the optic axis induces a change in the refractive index of $$\delta n = -\tfrac{1}{2}(n_o^3 \, r_{13} E_e)$$

for light propagating along the optic axis, where '$n_o$' is the refractive index in the absence of a field, '$r_{13}$' is the relevant linear electro-optic coefficient and $E_3$ is the applied field. The passband can be shifted to any wavelength within its free spectral range by application of $\pm \tfrac{1}{2} V_{\frac{1}{2}}$, where $$V_{\frac{1}{2}} = \lambda/n_o^3 r_{13}$$

where $\lambda$ is the wavelength of the light.

Thus in the etalon filter employed in the instrument of the present invention, application of an electric field induces a change in the refractive index thereof for light propagating along the optic axis. Such filter is thus readily tuned. The tuning requirements of the filter and that of the instrument or solar vector magnetograph are modest. Typical spectral lines are only 0.2Å wide and ±500V will tune the etalon filter through 0.4Å.

Thus changing the voltage and thus the applied electric field can produce passband shifts of, e.g., 0.2Å increments in the etalon filter of the invention so as to exclusively admit a certain wavelength, e.g., at −500V, 6122.0 Å is admitted; at 0V, 6122.2 Å is admitted and at +500V, 6122.4 Å is admitted.

Any intensity variation in the transmitted beam can be related to the polarization state and the spectrum of the sunlight. To this end, polarization analysis of the beam is used, i.e., linear vertical, linear horizontal, right circular and left circular components can, when processed by the instrument of the present invention, provide images which can be assembled and compared to provide considerable solar magnetic field information.

This is done as indicated above, by placing a variable or removeable quarter wave retarder followed by a rotating-prism polarizer in the incoming beam path between the telescope and the blocking filter. The prism alone is used to measure linear polarization states and the retarder is added only in measurements of the circular state. Thus, with the retarder removed from the beam path, the prism is rotated to deflect, e.g., the linear vertically polarized light component out of the path and to pass the linear horizontal polarized component through the optical system, including through the blocking filter and then through the etalon filter which is tuned to a specific passband setting, to the CCD camera (for, e.g., 10 seconds), which records a specific solar image. The prism is then rotated 90° to deflect the horizontal polarized component out of the path and to now pass the vertical polarized component through the optical system, for sufficient time, (e.g., 10 seconds), to the CCD camera to record another image of the solar zone being observed. The prism is then rotated back to 45° to deflect one polarized beam component and pass the other through the optical system to obtain a third recorded image after which the prism is then rotated forward to 135° to deflect the just-passed component and pass the other component through the optical system to obtain a fourth recorded image for confirmation purposes.

Thereafter the quarter wave retarder is inserted into the incoming beam between telescope and rotating prism to convert the right circular and left circular polarized light components to linear components, i.e., horizontal and vertical linear components and the prism is rotated to deflect one such linear component and pass the other through the optical system for recording a fifth image and then the prism is rotated to another desired angle, to deflect the linear polarized component just passed and to pass the other component through the optic system to record a sixth image. As indicated above, each image is recorded in about 10 seconds although a range of 0.2 to 20 seconds can be employed as desired within the scope of the invention.

From a comparison of the so-obtained six images, a composite image of the intensity and the direction of the magnetic field at the observed solar locale can be derived. However, by tuning the etalon filter to another (nearby) passband and by repeating the above steps to obtain six more such polarized light component images and comparing them with the first six, one obtains a clearer solar magnetic field image or magnetogram. Thereafter tuning the etalon filter to a third (nearby) narrow passband and repeating the above process to record another six images and comparing all 18 such images, provides a yet clearer image or magnetogram of the intensity and the direction of the magnetic field at the observed solar locale.

Accordingly, one can utilize the instrument of the invention for 1 to 6 to 12 to 18 or more such images, to compare and assemble a solar magnetogram. However obtaining 18 such images in preparation thereof, is preferred because this allows rejection of spurious signals due to e.g., the Doppler effect.

Comparison of the off-axis behavior of a F-P etalon with the Doppler shifts due to solar rotation, shows that, if the etalon is operated at an appropriate tilt from the sun center-to-telescope ray, the Doppler shifts, can be closely matched (cancelled). Thus, the etalon filter of the invention provides a passband that is at once narrow and correctly positioned on the spectral line everywhere in the field of view.

As noted above, the etalon filter and thus the solar vector magnetograph of the present invention can be readily tuned to select various passbands of the solar spectrum and to store the resulting images thereof (via, e.g., the CCD camera and an electrically connected TV monitor or electronic storage device, not shown), for each such passband, and to compare such images to isolate the emissions of atomic species to infer the magnetic field in a solar zone.

By "solar zone" as used herein, is meant a locale in or on the photosphere or thereabove, e.g., in the solar atmosphere.

The results of such a comparison of solar images from three passbands is shown as a magnetogram 70 in FIG. 4, wherein the white area 72 denotes outwardly directed magnetic fields per arrow 74 and the dark area 76 denotes inwardly directed magnetic fields per the arrow 78 in a solar zone.

Employing a series of the magnetograms of FIG. 4, the solar measuring instrument of the present invention can measure all three components of the solar magnetic field (vectors x, y and z) with a sensitivity of 0.005 to 0.01T and a spatial resolution on the sun of 500 km to thus derive a map of the magnetic field vectors in a solar active zone or region. Such specifications are beyond the reach of prior art instruments.

The sequences of exposures required to build up low-noise magnetograms will be, e.g., 1–20 minutes long or more. Thus the solar image in the CCD camera must be held stable, which is accomplished by the IMC (image motion compensator). The minor beam 26 that passes through the beam splitter at 20 is deflected by fold mirror 22 through a series of lenses to a photodiode array which is electrically and optically linked with an image motion compensation system based on correlation of sequential images (not shown). The system includes a correlation algorithm for computing the solar image offset based on images obtained by the photodiode tracking array. A relay mirror position is updated at a 50-Hz rate as the sensed image is compared with a periodically updated reference image to produce signals to steer the IMC mirror 18 to maintain the solar image constant at the final image plane, e.g., the CCD camera, despite atmospheric turbulence, flexure in the telescope and the like.

After the polarized beam components are filtered, imaged and recorded, for each etalon passband setting, a computer algorithm then compares a series of, e.g., 6 images at the 3 different passbands or a total of 18 images and then infers the intensity and direction of the magnetic field at such solar locale and produces on a monitor connected to a computer (not shown) a magnetogram thereof, an example of which is shown in FIG. 4.

According to the invention, the above magnetogram can be prepared from just 2 such images. However 6 images at 1 to 3 passbands provide more data and 6 images at 3 passbands are preferred as discussed above.

Concurrently, the IMC system 27 maintains pointing stability in the magnetograph optical train on the desired locale of the photosphere so as to hold the solar image in the CCD camera stable, to obtain a non-blurred or relatively clear magnetogram.

For a more detailed discussion on the respective components of the magnetograph of the present invention, attention is directed to an article by D. M. Rust et al., "An Optical Instrument for Measuring Solar Magnetism", Johns Hopkins APL *Technical Digest*, Vol 9, No. 4 (1988), at pages 349-359, which is incorporated herein by reference.

An effective telescope for the vector magnetograph of the invention is a 25 cm aperture CASSEGRAIN telescope which allows a large field of view although the telescope is very compact, i.e. 60 cm long. However a 1 meter aperture telescope is recommended to realize shorter exposure times and higher resolution of solar magnetograms.

A blocking filter can be employed in the magnetograph of the invention to pass various narrow passbands, e.g., from 3000 Å to 20,000 Å of the visible spectrum. However, one must take into account the range of the solid etalon filter of the invention. In the case of lithium niobate the passband range is 4000 Å to 40,000 Å. Thus the effective range of the instrument of the invention is 4000 Å to 20,000 Å and a blocking filter can be selected in that range, e.g., 4861Å to produce a blue beam or 5250Å to produce a green beam. However a blocking filter set in the red portion of the spectrum, e.g., at 6122 Å, is preferred for solar observation and measurements according to the present invention.

Use of F-P etalon filters according to the instrument of the invention and the above prism polarizer requires special attention and the above prism polarizer requires special attention to beam diameters in the magnetograph. The beam diameter at the etalon filter should be large to minimize the cone angle because the passband broadens in proportion to the square of that angle. A large but different beam diameter must be used at the blocking filter for similar reasons, while the small aperture of practical prism polarizers dictates a narrow beam thereat.

Both the narrow bandpass blocking filter and the solid etalon filter are preferably maintained in temperature controlled housings to stabilize their passbands. As noted above, high voltage leads are connected to such etalon filter for rapid passband tuning. As further noted above, the wafer component of the solar etalon filter is preferably of lithium niobate. However wafers of other materials, as noted above, can be substituted between the reflective and conductive layers of the etalon filter as desired, within the scope of the invention.

The wafer and other components of the etalon filter of the invention, including the reflective dimensions as called for by the size of the components in the solar vector magnetograph (VMG) as desired within the scope of the present invention.

It is desirable according to the invention, that the telescope form near diffraction-limited images and that the custom relay optics for the VMG convey the solar images to the image plane without degrading the resolution thereof.

To map the magnetic fields, high pixel density camera, e.g., a 576×384 pixel CCD camera and image collection system is preferred. The CCD camera allows for rapid quantitative evaluation of diffraction patterns, image scale and the like during testing. Accordingly the present invention provides in the solar vector magnetograph, an instrument that measures solar magnetic fields with high spatial resolution, high optical throughput and fine spectral selectivity Thus the magnetograph of the present invention provides a method to measure, in minutes, the intensity and all three directional vectors of a solar magnetic field with a high degree of sensitivity and spatial resolution due to the utilization of the solid F-P etalon filter in the optical system of such instrument. The solar magnetograph of the present invention further can measure the magnetic field at a solar locale at a plurality of different wavelengths by electrically tuning an etalon filter of a desired passband and inserting various suitable blocking filters and transmitting the respective images through such filters to an image receptor such as a CCD camera for recording, comparison and magnetic field mapping of, e.g., the photosphere as discussed above. Such mapping may well give several hours warning before a major flare onset or other solar disturbance.

What is claimed is:

1. In an instrument for observing and measuring solar magnetic fields including a telescope pointable to a solar zone, and having mounted in optical alignment therebehind, a collimating lens, a light polarization analyzer, a beam expanding means, a narrow bandpass blocking filter to admit a narrow spectral band of polarized light, a reimaging lens to focus said beam and an image receiver, the improvement comprising, a solid etalon filter mounted between said blocking filter and said reimaging lens which etalon filter is of a desired refractive index and thickness so as to select a narrow spectral band of the so-transmitted polarized light and transmit it to said image receiver all in order to isolate and record the emissions of atomic species and to infer therefrom the magnetic field at said solar zone and means to change the refractive index along the optic axis of said etalon filter to select at least one other narrow spectral band of the transmitted polarized light for comparison purposes, to read direction and intensity of solar magnetic fields and to construct solar vector magnetic field maps thereof.

2. The instrument of claim 1 wherein said etalon filter is pivotably mounted.

3. The instrument of claim 1 wherein said etalon filter includes an electro-optic crystal wafer, which wafer has a reflective layer mounted thereto on each of two opposed sides thereof.

4. The instrument of claim 3 wherein said wafer is of a thickness to space its two reflective layers apart by a multiple of half a wavelength used to measure the solar magnetic field at between 4,000 Å and 20,000 Å.

5. The instrument of claim 3 wherein each of said reflective layers is surmounted with a conductive layer with means to apply an electric field to said conductive layers.

6. The instrument of claim 5 having means to apply a DC voltage field to said conductive layers.

7. The instrument of claim 1 wherein said etalon filter includes a wafer of lithium niobate.

8. The instrument of claim 7 wherein said etalon filter is of lithium niobate polished to 40-50 Å flatness.

9. The instrument of claim 1 having means to apply an electric field to said etalon filter to change the refractive index along the optic axis thereof to tune same.

10. The instrument of claim 1 having means to apply an electric field to said etalon filter to change the refractive index along the optic axis thereof to select a different narrow spectral band of the transmitted polarized light for comparison purposes, to read direction and intensity of solar magnetic fields and to construct solar vector magnetic field maps thereof.

11. The instrument of claim 1 having means to vary the temperature of said etalon filter to change the refractive index along the optic axis thereof to select a different narrow spectral band of the transmitted polarized light for comparison purposes, to read direction and intensity of solar magnetic fields and to construct solar vector magnetic field maps thereof.

12. The instrument of claim 1 having means to tilt said etalon filter to change the effective beam path length therein to select a different narrow spectral band of the transmitted polarized light spectrum for comparison purposes, to read direction and intensity of solar magnetic fields and to construct solar vector magnetic field maps thereof.

13. The instrument of claim 1 wherein said image receiver is a charge-coupled-device camera.

14. The instrument of claim 13 wherein an image enlarging optic is positioned in the optical path between the reimaging lens and said camera.

15. The instrument of claim 3 wherein said light polarization analyzer includes a quarter wave retarder and a rotatably mounted prism.

16. The instrument of claim 3 wherein said telescope is a reflective telescope.

17. The instrument of claim 1 wherein said beam expanding means is a pair of lenses mounted before said blocking filter and another pair of lenses mounted before said etalon filter.

18. The instrument of claim 17 wherein said beam expander lenses locate a pupil image at said etalon filter.

19. The instrument of claim 18 wherein a pivotable mirror is mounted in the optic path behind said light polarizing means with a beam splitter and a solar image motion compensator assembly mounted in off-set alignment therewith so that said mirror directs said beam to said beam splitter, which deflects the major portion of the beam to said blocking filter and the minor beam portion therethrough to said compensator which is electrically connected to said mirror and is responsive to variations in said minor beam to steer said mirror in the pre-split beam so as to hold stable the solar image transmitted to said camera.

* * * * *